(12) United States Patent
Nakata

(10) Patent No.: US 11,302,538 B2
(45) Date of Patent: Apr. 12, 2022

(54) SEMICONDUCTOR DEVICE MANUFACTURING METHOD

(71) Applicant: Mitsubishi Electric Corporation, Tokyo (JP)

(72) Inventor: Yosuke Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/931,678

(22) Filed: Jul. 17, 2020

(65) Prior Publication Data

US 2021/0125838 A1 Apr. 29, 2021

(30) Foreign Application Priority Data

Oct. 25, 2019 (JP) .............................. JP2019-193952

(51) Int. Cl.

| | |
|---|---|
| *H01L 23/58* | (2006.01) |
| *H01L 21/44* | (2006.01) |
| *H01L 21/48* | (2006.01) |
| *H01L 21/50* | (2006.01) |
| *H01L 21/56* | (2006.01) |
| *H01L 21/3105* | (2006.01) |
| *H01L 21/304* | (2006.01) |
| *H01L 21/683* | (2006.01) |
| *H01L 21/78* | (2006.01) |

(52) U.S. Cl.
CPC ........ *H01L 21/561* (2013.01); *H01L 21/3043* (2013.01); *H01L 21/3105* (2013.01); *H01L 21/6836* (2013.01); *H01L 21/78* (2013.01); *H01L 2221/68327* (2013.01)

(58) Field of Classification Search
CPC ..... H01L 25/0657; H01L 24/24; H01L 24/97; H01L 25/50; H01L 23/3121
See application file for complete search history.

(56) References Cited

U.S. PATENT DOCUMENTS

| | | | |
|---|---|---|---|
| 2004/0188134 A1* | 9/2004 | Sato ..................... | H05K 3/4655 174/255 |
| 2006/0006488 A1* | 1/2006 | Kanbe ................. | H01L 27/1464 257/443 |
| 2010/0072635 A1* | 3/2010 | Kuo ........................ | H01L 24/13 257/797 |
| 2011/0062596 A1* | 3/2011 | Murayama .......... | H01L 25/0657 257/777 |
| 2015/0235845 A1 | 8/2015 | Sekita et al. | |
| 2018/0350707 A1* | 12/2018 | Kishida ................... | H01L 33/44 |

FOREIGN PATENT DOCUMENTS

JP  2015-173253 A  10/2015

* cited by examiner

*Primary Examiner* — Brian Turner
(74) *Attorney, Agent, or Firm* — Studebaker & Brackett PC

(57) ABSTRACT

A semiconductor device manufacturing method includes processes of: applying a protective film precursor solution over an end of each of a plurality of semiconductor element structures and a side surface and a bottom surface of a groove; roughly drying a solvent in the protective film precursor solution to form a protective film; and performing full-curing to evaporate a solvent in the protective film after a process of cutting between the plurality of semiconductor element structures or a process of peeling a plurality of semiconductor elements from a dicing tape.

12 Claims, 26 Drawing Sheets

F I G. 1
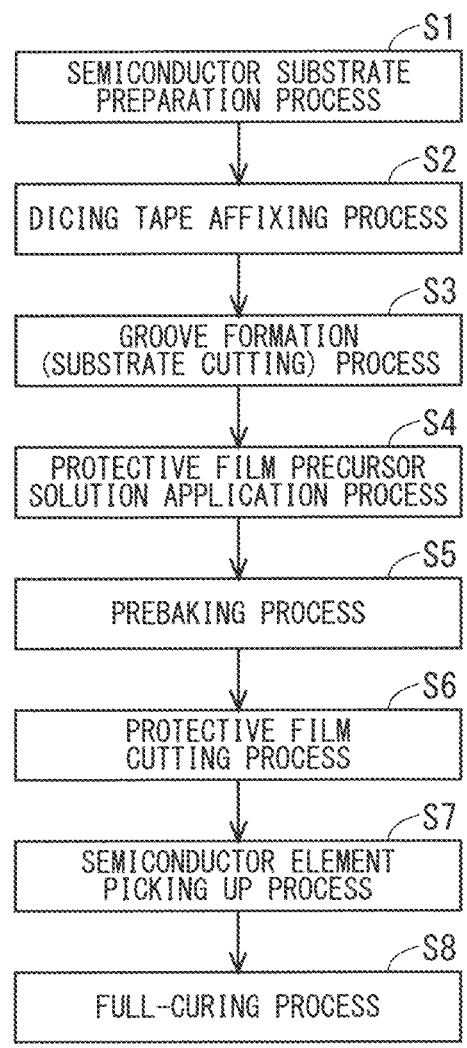

F I G. 5
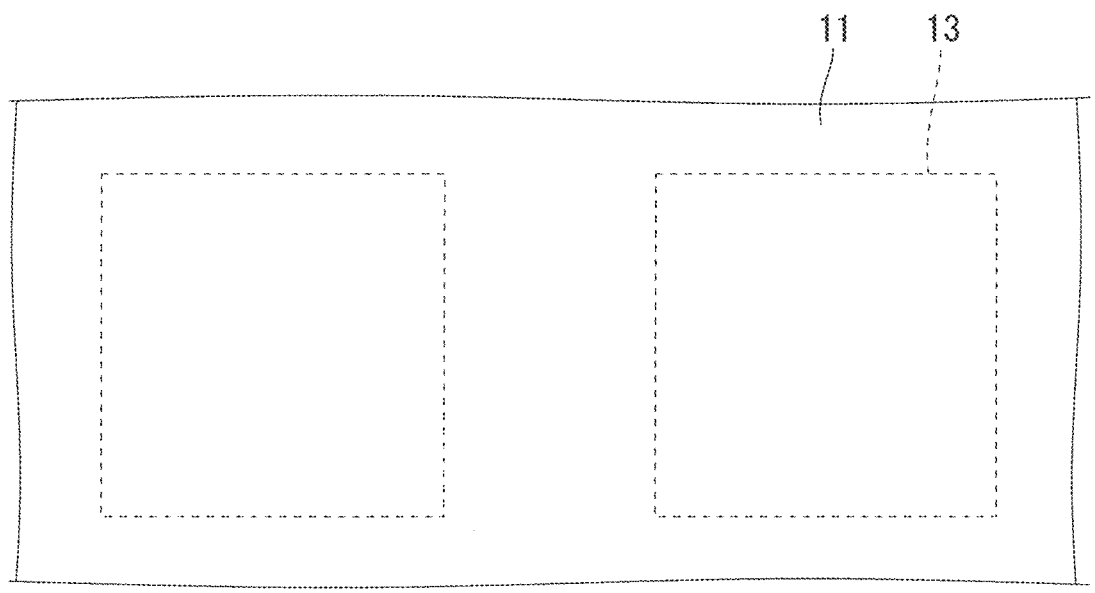

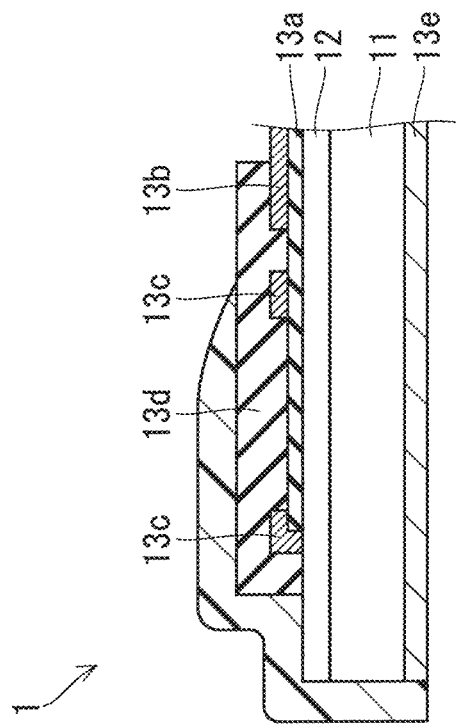
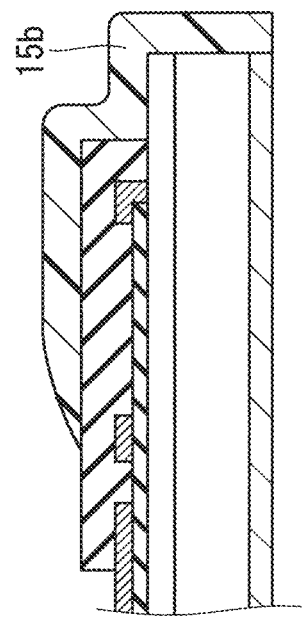
FIG. 12

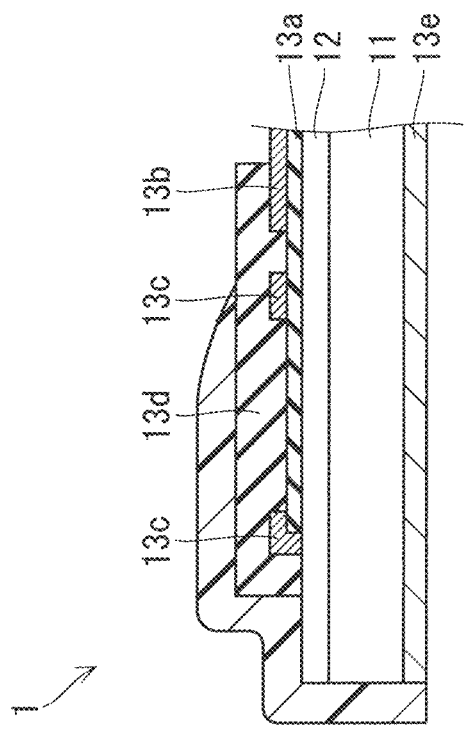
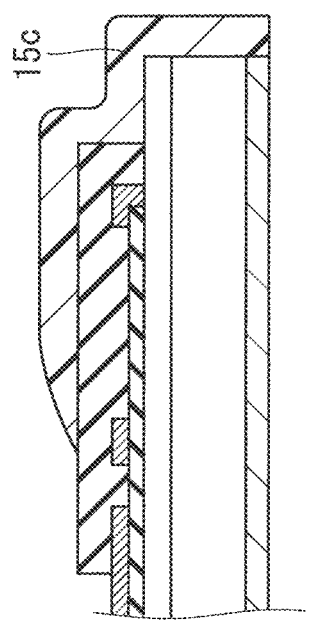
FIG. 14

F I G. 16
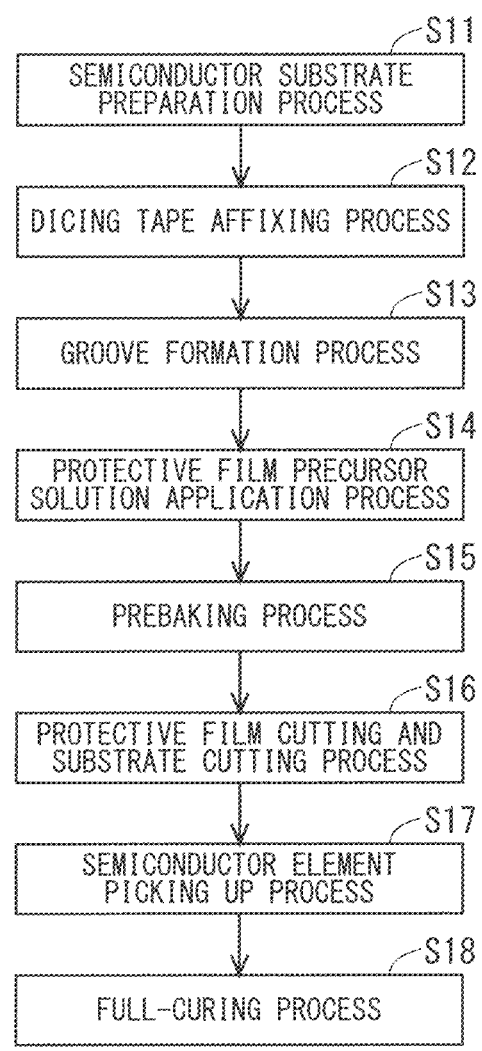

F I G. 18
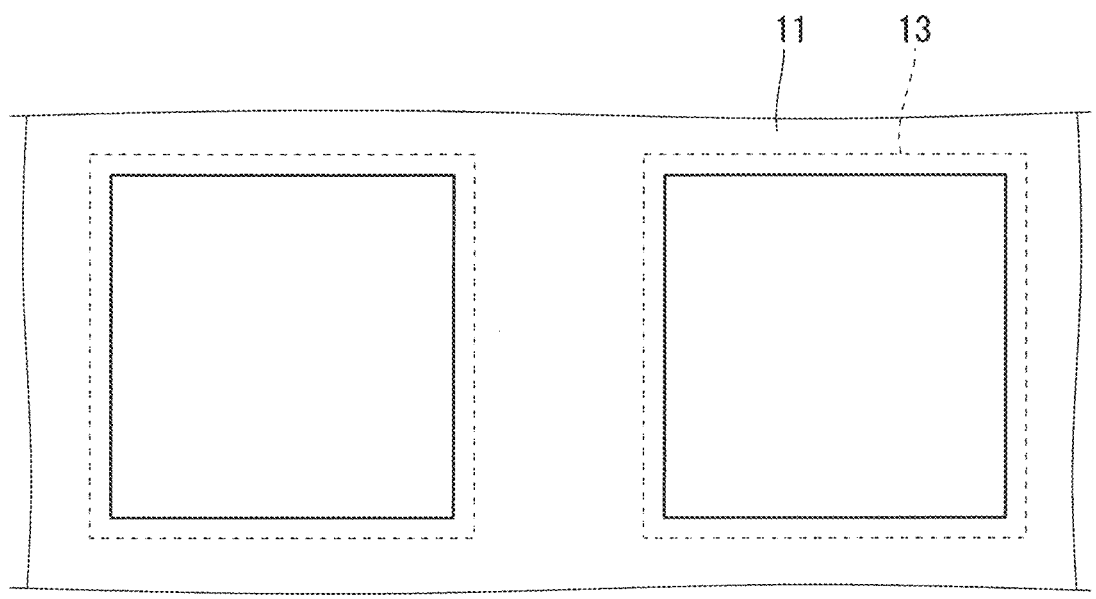

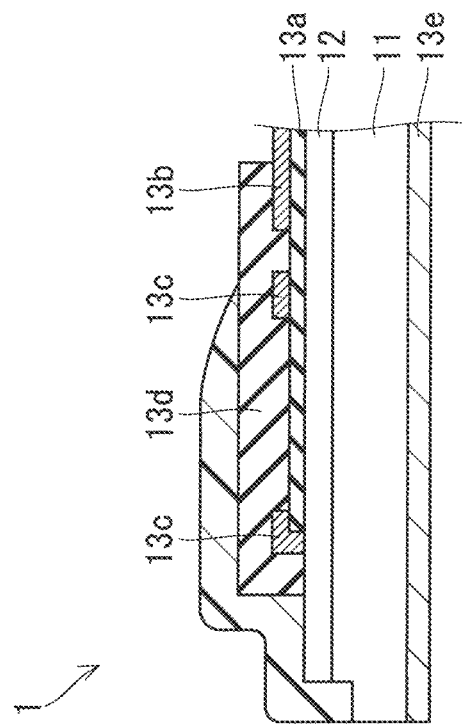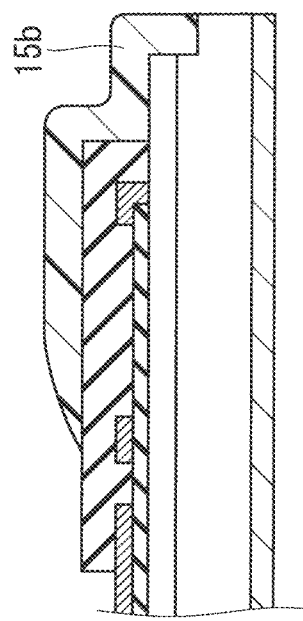
FIG. 23

FIG. 25
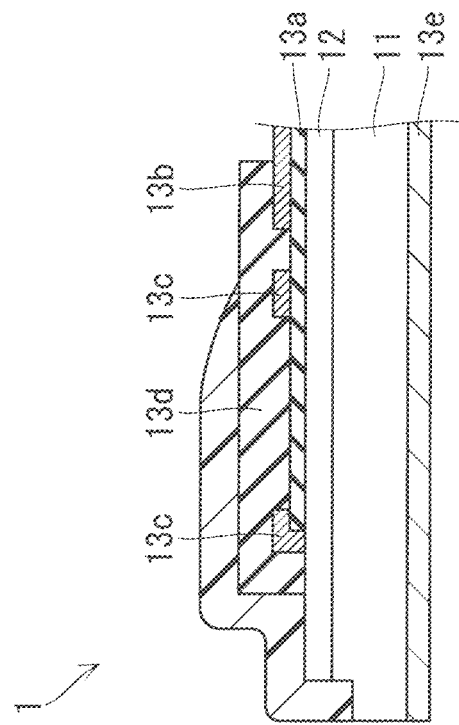
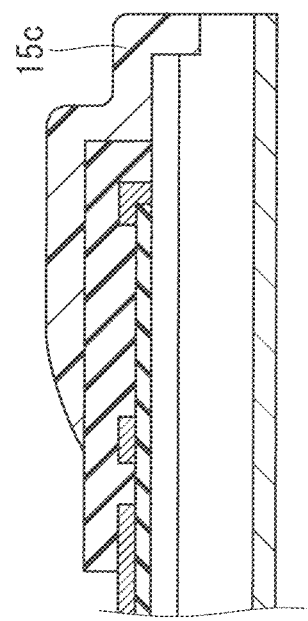

SEMICONDUCTOR DEVICE MANUFACTURING METHOD

BACKGROUND OF THE INVENTION

Field of the Invention

The present invention relates to a semiconductor device manufacturing method for forming a semiconductor element on which a protective film is disposed.

Description of the Background Art

It has been proposed, in a power semiconductor device, to mount a thin semiconductor element made of SiC in place of a semiconductor element made of Si to further reduce losses and to accommodate high-temperature operation. It has also been proposed to form a protective film on a surface of such a semiconductor element to protect the surface (e.g., Japanese Patent Application Laid-Open No. 2015-173253).

In a semiconductor device manufacturing method disclosed in Japanese Patent Application Laid-Open No. 2015-173253, with respect to a semiconductor wafer on which back metal and a protective film have been disposed and which has been thinned to have a thickness of approximately 100 μm, full-curing of the protective film is performed, and then a dicing process is performed. Such a manufacturing method, however, has a problem in that film stress of the back metal and the protective film increases due to thermal history of full-curing of the protective film, so that the thinned semiconductor wafer is warped to make it difficult to properly perform a cutting process, such as dicing, to cut out semiconductor elements thereafter.

SUMMARY

The present disclosure has been conceived in view of a problem as described above, and it is an object to provide technology for properly performing a cutting process in a semiconductor element on which a protective film is disposed.

The present disclosure is a semiconductor device manufacturing method including processes of: (a) preparing a semiconductor substrate over which a plurality of semiconductor element structures are disposed; (b) affixing the semiconductor substrate to a dicing tape; (c) forming, after the process (b), a groove in the semiconductor substrate between the plurality of semiconductor element structures; (d) applying a protective film precursor solution over an end of each of the plurality of semiconductor element structures and a side surface and a bottom surface of the groove; (e) roughly drying a solvent in the protective film precursor solution to form a protective film; (f) cutting the protective film along the groove; (g) cutting between the plurality of semiconductor element structures; (h) peeling, after the process (f), a plurality of semiconductor elements formed by cutting in the process (g) from the dicing tape; and (i) performing, after the process (g) or the process (h), full-curing to evaporate a solvent in the protective film.

The cutting process can properly be performed in the semiconductor element which the protective film is disposed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a flowchart showing a semiconductor device manufacturing method according to Embodiment 1;

FIG. 5 is an enlarged plan view illustrating the process of the semiconductor device according to Embodiment 1;

FIG. 12 is an enlarged sectional view illustrating a process of the semiconductor device according to Embodiment 1;

FIG. 14 is an enlarged sectional view illustrating a process of the semiconductor device according to Embodiment 1;

FIG. 16 is a flowchart showing a semiconductor device manufacturing method according to Embodiment 2;

FIG. 18 is an enlarged plan view illustrating the process of the semiconductor device according to Embodiment 2;

FIG. 23 is an enlarged sectional view illustrating a process of the semiconductor device according to Embodiment 2;

FIG. 25 is an enlarged sectional view illustrating a process of the semiconductor device according to Embodiment 2.

DESCRIPTION OF THE PREFERRED EMBODIMENTS

Embodiments will be described below with reference to the accompanying drawings. Features described in each of the embodiments below are examples, and all the features are not necessarily required. In description shown below, similar components in a plurality of embodiments bear the same reference sign or similar reference signs, and different components are mainly described. In description made below, terms representing specific locations and directions, such as "upper", "lower", "left", "right", "front", and "back", do not necessarily match directions in actual use.

Embodiment 1

Figure 2:
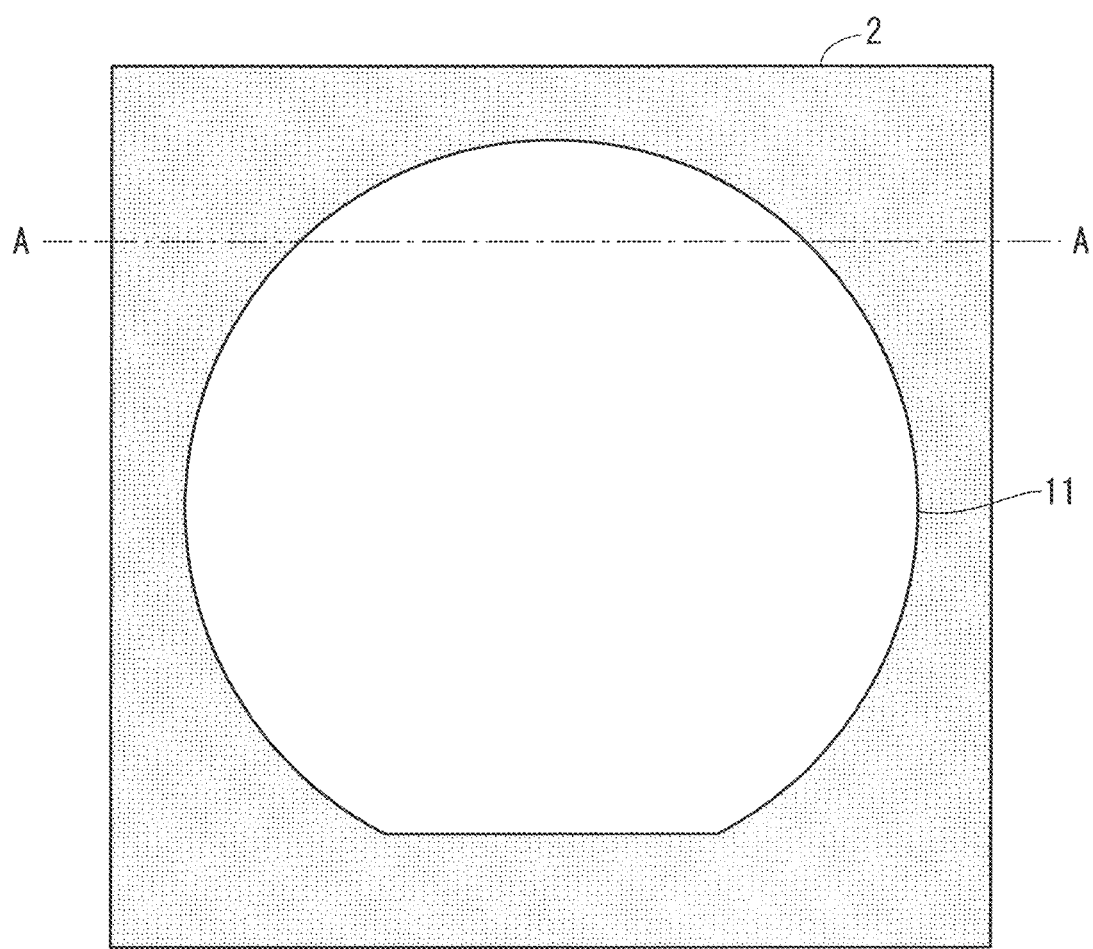
FIG. 2 is a plan view illustrating a process of a semiconductor device according to Embodiment 1.
Figure 3:
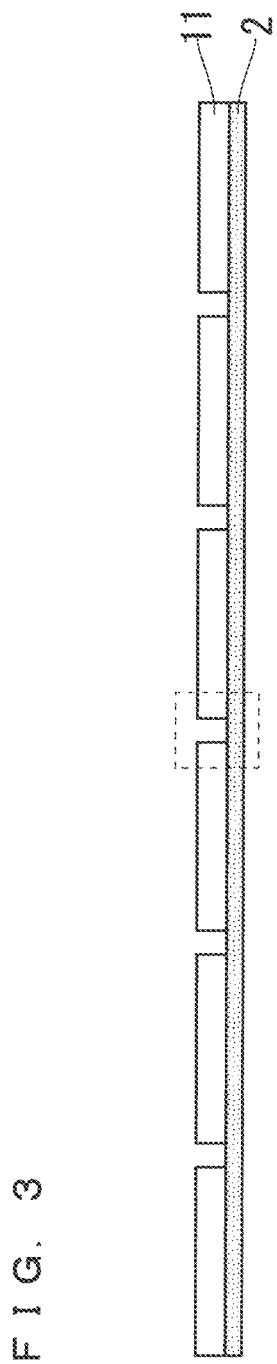
FIG. 3 is a sectional view illustrating the process of the semiconductor device according to Embodiment 1.
Figure 4:
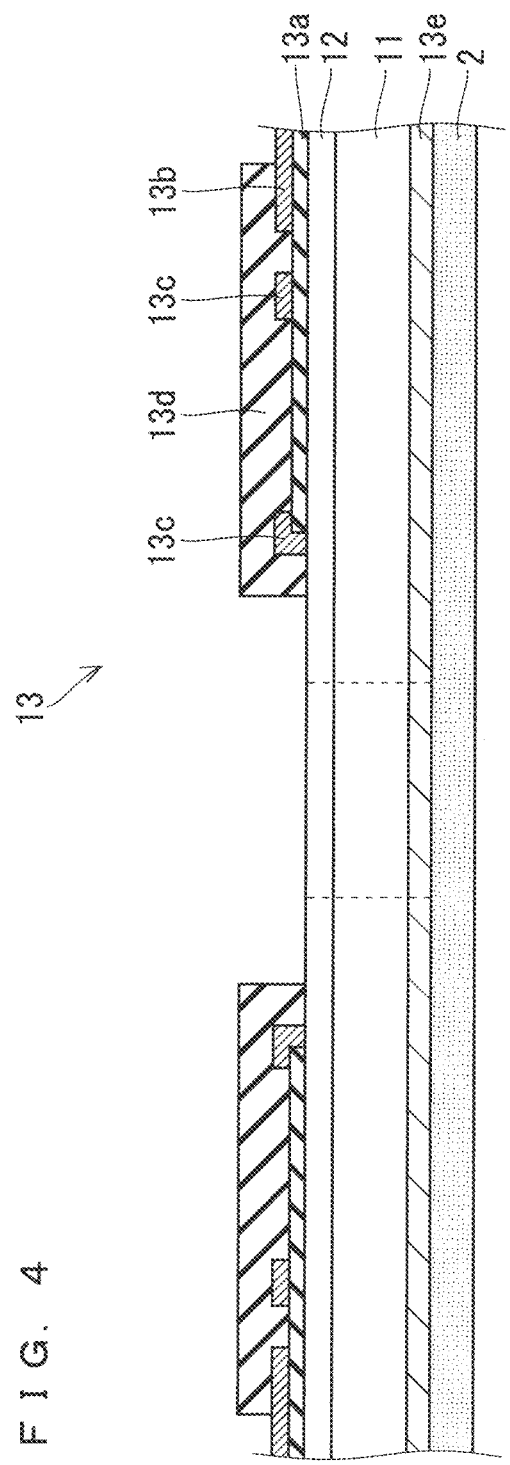
FIG. 4 is an enlarged sectional view illustrating the process of the semiconductor device according to Embodiment 1.

FIG. 1 is a flowchart showing a semiconductor device manufacturing method according to Embodiment 1 of the present invention. FIG. 2 is a plan view illustrating a state when a process in a step S2 ends, and FIG. 3 is a sectional view taken along the line A-A of FIG. 2. FIG. 4 is an enlarged sectional view of a dashed-line portion of FIG. 3, and FIG. 5 is an enlarged plan view corresponding to FIG. 4.

First, as illustrated in FIGS. 4 and 5, a semiconductor substrate 11 over which a plurality of semiconductor element structures 13 are disposed is prepared in a step S1. Then, as illustrated in FIGS. 3 and 4, the semiconductor substrate 11 is affixed to a dicing tape 2 in the step S2.

The semiconductor substrate 11 may be configured by a typical semiconductor wafer or may be an epitaxial layer manufactured by growing the epitaxial layer on a semiconductor wafer, and then removing the semiconductor wafer. The semiconductor substrate 11 is described below as the typical wafer. In Embodiment 1, an epitaxial layer 12 is disposed on a surface of the semiconductor substrate 11. In Embodiment 1, the semiconductor substrate 11 is finished to have a thickness of approximately 100 μm to reduce stress when being incorporated into a semiconductor device and to reduce electrical resistance when being energized.

The semiconductor element structures 13 are structures to become semiconductor elements after undergoing processes described below. The semiconductor elements include at least one of metal oxide semiconductor field effect transistors (MOSFETs), insulated gate bipolar transistors (IGBTs), Schottky barrier diodes (SBDs), and pn junction diodes (PNDs), for example.

As illustrated in FIG. 4, the semiconductor element structures 13 according to Embodiment 1 each include an oxide film 13a, a front surface electrode 13b, wiring 13c, a wiring covering film 13d, and a rear surface electrode 13e. The oxide film 13a is selectively disposed on a surface of the epitaxial layer 12, the front surface electrode 13b and the wiring 13c are selectively disposed on the epitaxial layer 12 and the oxide film 13a, and the wiring covering film 13d is disposed to cover the front surface electrode 13b and the wiring 13c. The rear surface electrode 13e is disposed on a rear surface of the semiconductor substrate 11.

In a case where the semiconductor substrate 11 is made of silicon carbide (SiC), stable operation at a high temperature and an increase in SW speed of the semiconductor elements are allowed. The semiconductor substrate 11 is not limited to the semiconductor substrate made of SiC as a wide bandgap semiconductor, may be made of another wide bandgap semiconductor, such as gallium nitride (GaN) and diamond, and may typically be made of silicon.

The dicing tape 2 is affixed to the rear surface electrode 13e. In a case of using, as the dicing tape 2, a dicing tape having adhesion reduced by ultraviolet (UV) irradiation, the semiconductor substrate 11 and the like can easily be peeled from the dicing tape 2 after a desired process.

Figure 6:
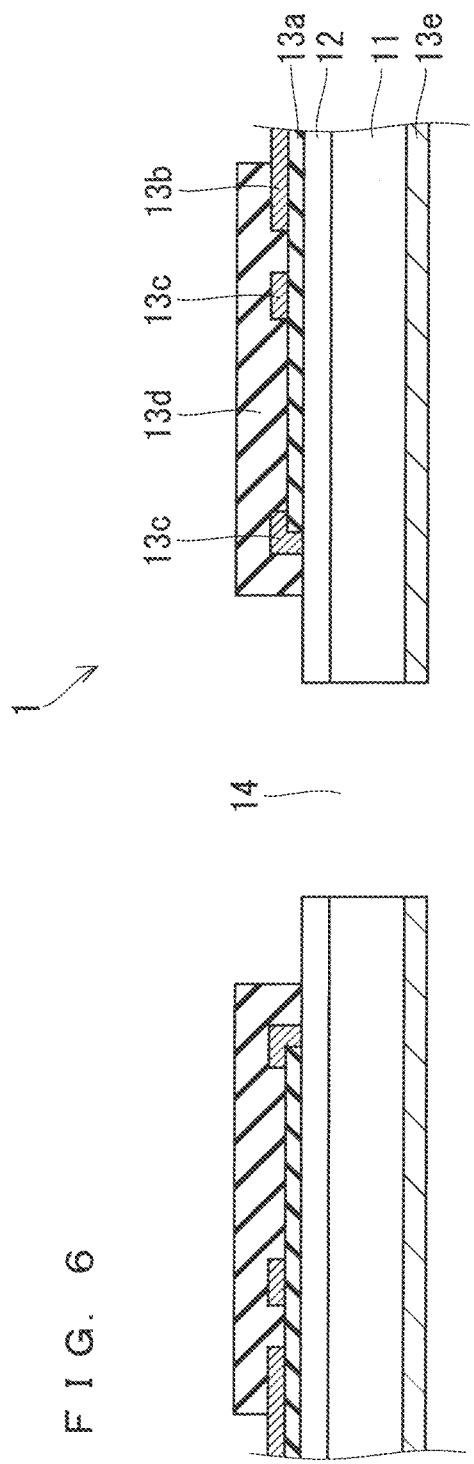
FIG. 6 is an enlarged sectional view illustrating a process of the semiconductor device according to Embodiment 1.
Figure 7:
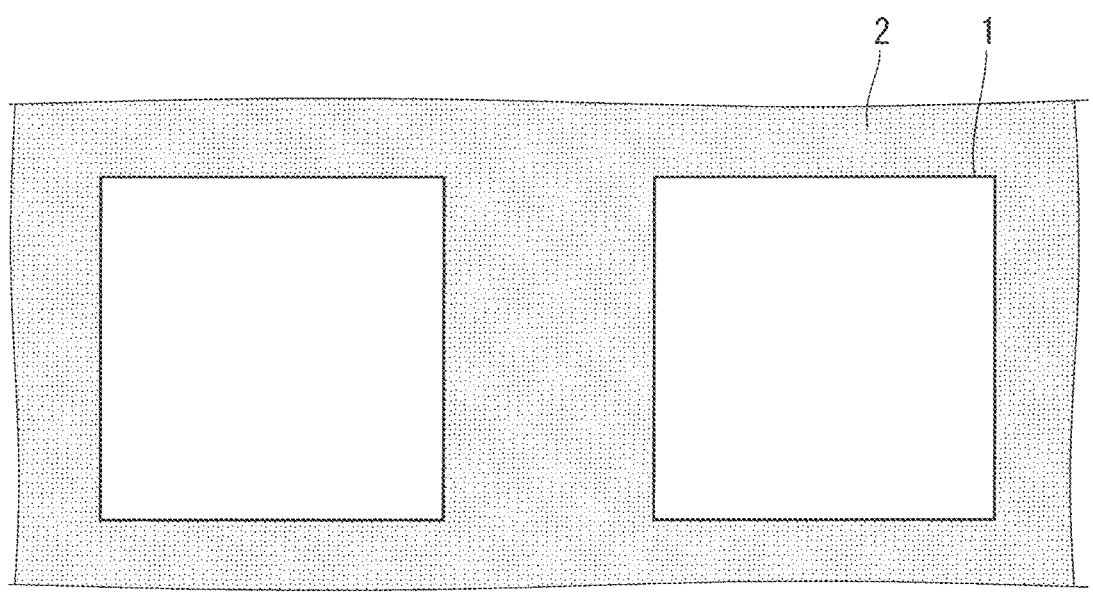
FIG. 7 is an enlarged plan view illustrating the process of the semiconductor device according to Embodiment 1.

In a step S3, a groove 14 is formed in the semiconductor substrate 11 between the plurality of semiconductor element structures 13 as illustrated in FIGS. 6 and 7. In Embodiment 1, the groove 14 is formed to cut between the plurality of semiconductor element structures 13. That is to say, in Embodiment 1, a process of forming the groove 14 in the semiconductor substrate 11 between the plurality of semiconductor element structures 13 includes a process of cutting between the plurality of semiconductor element structures 13. In the process of cutting the semiconductor substrate 11 in the step S3, a dicing process using a blade (grinding wheel in the form of a rotary blade) is used, for example. In the process of cutting the semiconductor substrate 11 in the step S3, a plurality of semiconductor elements 1 are cut out of the semiconductor substrate 11, and the dicing tape 2 is partially exposed from the semiconductor substrate 11. In Embodiment 1, the semiconductor element structures 13 after the process are substantially the same as the semiconductor elements 1.

Figure 8:
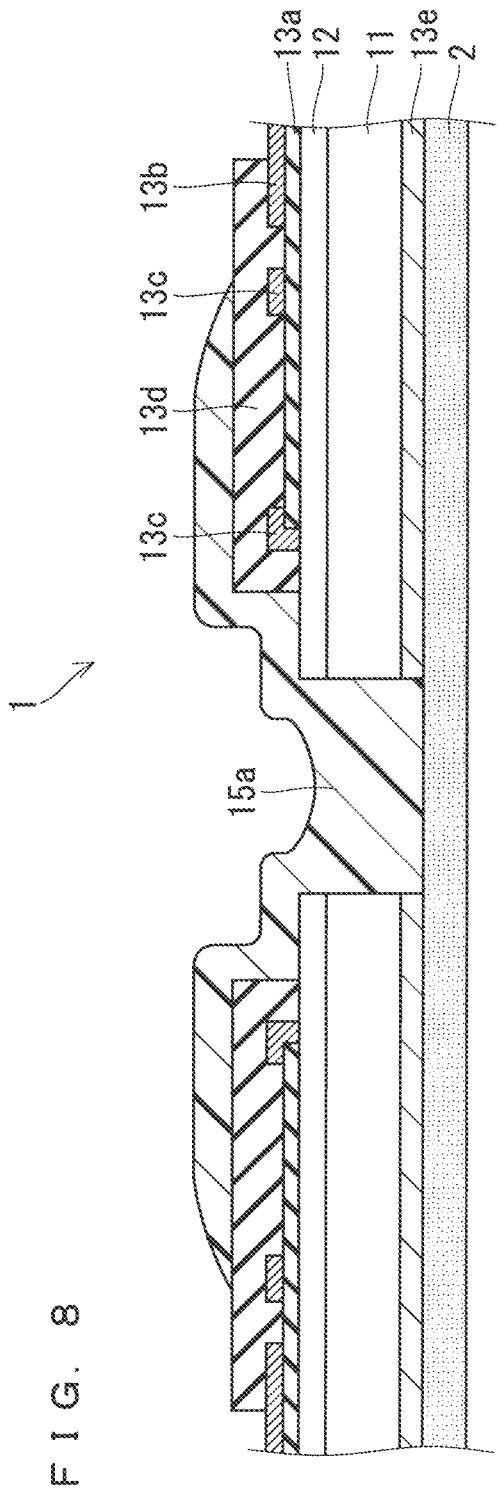
FIG. 8 is an enlarged sectional view illustrating a process of the semiconductor device according to Embodiment 1.
Figure 9:
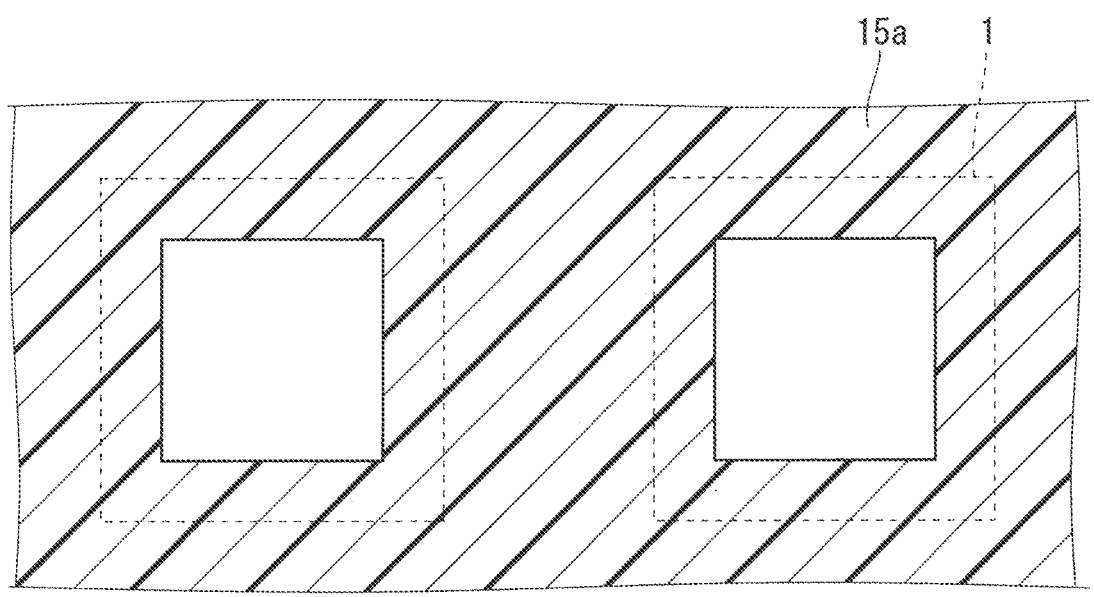
FIG. 9 is an enlarged plan view illustrating the process of the semiconductor device according to Embodiment 1.

In a step S4, a protective film precursor solution 15a is applied over an end of each of the plurality of semiconductor element structures 13 and a side surface and a bottom surface of the groove 14 as illustrated in FIGS. 8 and 9. In Embodiment 1, application is performed in this manner to apply the protective film precursor solution 15a over the end and a side wall of each of the plurality of semiconductor elements 1 and an exposed upper surface of the dicing tape 2.

It is preferable to selectively apply the protective film precursor solution 15a only to the above-mentioned region along a dicing line using, for example, a dispenser and the like. By applying the protective film precursor solution 15a in such a manner, the protective film precursor solution 15a can be applied only to the end of the semiconductor element 1 and the dicing line without being applied to the other region, so that an adverse effect of the protective film precursor solution 15a on the other processes can be suppressed. Furthermore, reduction in thickness of the protective film precursor solution 15a and thickness of a protective film 15b to be formed in the next process at a corner of the semiconductor element 1 at which application is necessary, which is caused by excessive wetting of the protective film precursor solution 15a, can be suppressed.

In a step S5, a prebaking process of roughly drying a solvent in the protective film precursor solution 15a to form the protective film 15b is performed. Rough drying is heating processing performed at a temperature lower than the temperature in a full-curing process, which will be described below, and is, for example, heating processing not to generate film stress of the protective film 15b and the like and not to warp the semiconductor substrate 11. In the prebaking process in the step S5, the protective film precursor solution 15a is heated in an air atmosphere using a hot plate at approximately 150° C., for example, although it depends on a material for the protective film 15b and the like. By roughly drying the solvent in the protective film precursor solution 15a to form the protective film 15b in a solidified state, a pattern defect of the semiconductor element 1 can be suppressed even if a jig and the like come into contact with an outer periphery of the semiconductor element 1.

Figure 10:
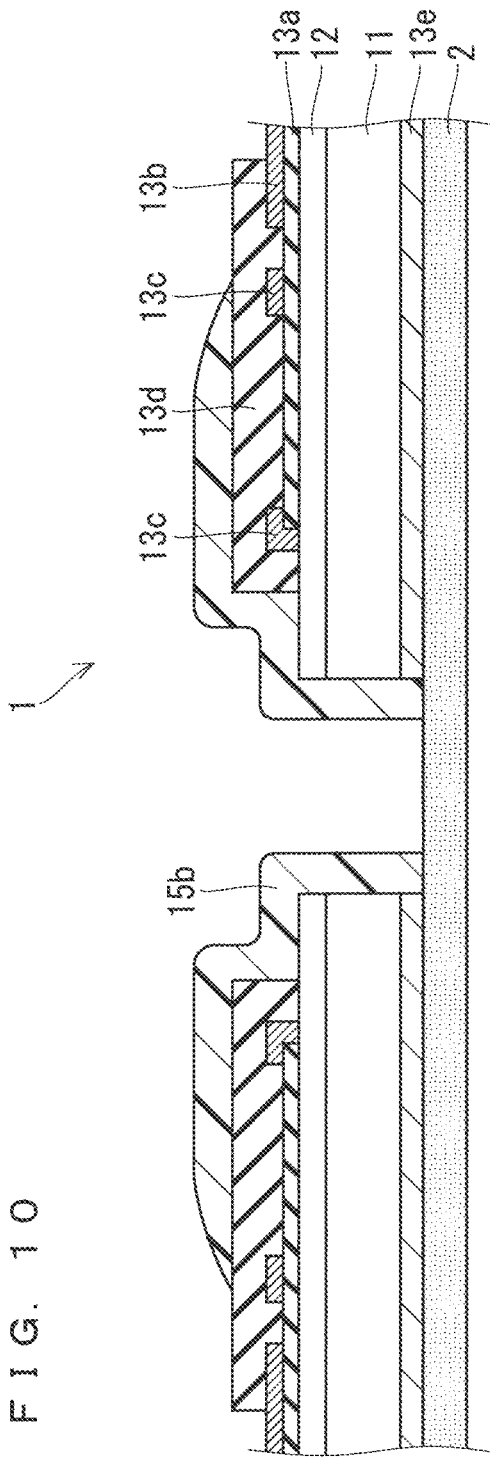
FIG. 10 is an enlarged sectional view illustrating a process of the semiconductor device according to Embodiment 1.
Figure 11:
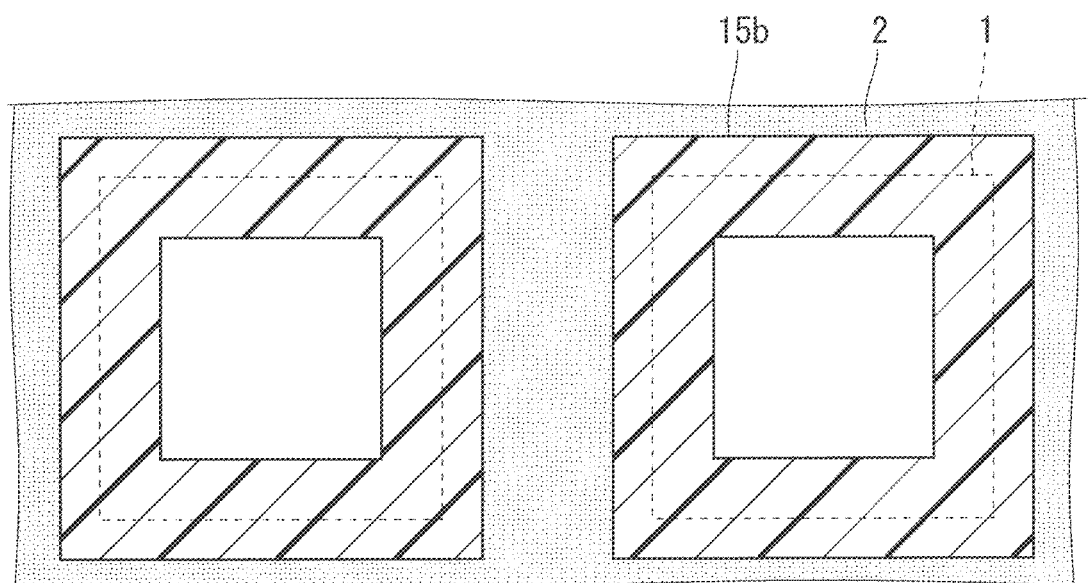
FIG. 11 is an enlarged plan view illustrating the process of the semiconductor device according to Embodiment 1.

In a step S6, the protective film 15b is cut along the groove 14, that is, the dicing line, while the protective film 15b at the end and the side wall of the semiconductor element 1 is left as illustrated in FIGS. 10 and 11. In a case where the protective film 15b is configured by an organic film of polyimide and the like, for example, a laser capable of easily cutting the organic film is used, for example, in the process of cutting the protective film 15b. By cutting the protective film 15b, each of the semiconductor elements 1 can easily be peeled (picked up) in the next peeling process (picking up process).

Figure 13:
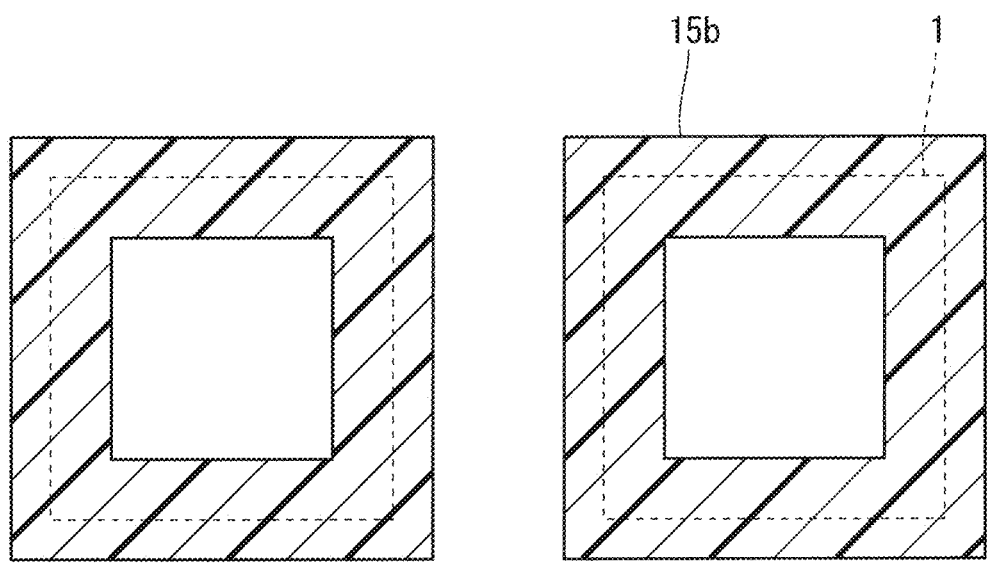
FIG. 13 is an enlarged plan view illustrating the process of the semiconductor device according to Embodiment 1.

In a step S7, the plurality of semiconductor elements 1 are peeled from the dicing tape 2 to be picked up as illustrated in FIGS. 12 and 13. Each of the semiconductor elements 1 can easily be picked up because the solvent is removed to some extent in the prebaking process in the step S5, and adjacent semiconductor elements 1 are not connected by the protective film 15b in the process of cutting the protective film 15b in the step S6. In preparation for the next full-curing process, the picked up semiconductor elements 1 are housed in a heat-resistant tray made of metal or carbon, for example.

Figure 15:
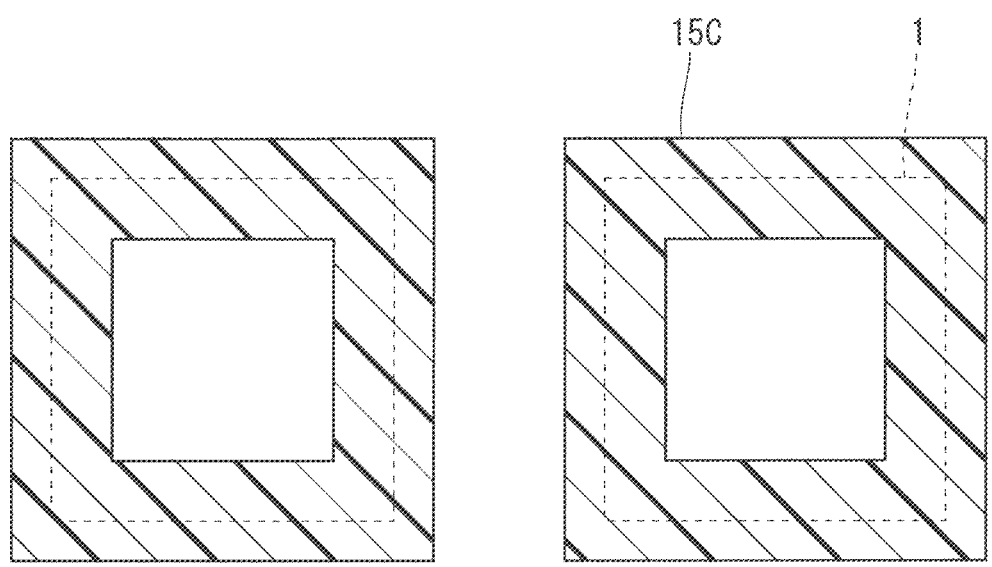
FIG. 15 is an enlarged plan view illustrating the process of the semiconductor device according to Embodiment 1.

In a step S8, full-curing to evaporate a solvent in the protective film 15b is performed to form a full-cured protective film 15c as illustrated in FIGS. 14 and 15. The prebaking process in the step S5 to roughly dry the solvent is typically performed at a temperature of 150° C. or less. The full-curing process in the step S8 to evaporate the solvent in the protective film 15b so that 95% or more of the solvent initially contained in the protective film precursor solution 15a is evaporated is performed at a temperature of more than 150° C. In a case where the protective film 15b is polyimide, for example, the full-curing process is performed at a temperature of 180° C. or more if polyimide is required to be imidized in the full-curing process. As one example, the protective film 15b is herein heated at a temperature of approximately 300° C. in the full-curing process in the step S8. Full-curing may be performed between the step S6 and the step S7 although it is performed herein after the step S7. After the step S8, the semiconductor element is sealed with a curable resin, such as an epoxy resin, as necessary to form a package.

Summary of Embodiment 1

If the full-curing process of the protective film 15b as in the step S8 is performed in a state of the plurality of the semiconductor element structures 13 being connected as a single semiconductor substrate, for example, the semiconductor substrate 11 such as the semiconductor wafer or the like is warped by an increase in film stress of the protective film 15b, the rear surface electrode 13e of each of the semiconductor element structures 13, and the like caused by heating. As a result, the cutting process, such as dicing, cannot properly be performed thereafter.

In contrast, in Embodiment 1, the full-curing process of the protective film 15b is performed after the plurality of semiconductor elements 1 are separated by cutting of the semiconductor substrate 11 and cutting of the protective film 15b. Cutting of the semiconductor substrate 11 and cutting of the protective film 15b can thereby be performed in a state before full-curing in which warping of the semiconductor substrate 11 is suppressed, so that they can properly be cut. Since the semiconductor elements 1 have already been separated, cumulative warping occurring on the plurality of semiconductor elements 1 connected by the dicing tape 2 does not occur after the full-curing process of the protective film 15b is performed. A process accompanied by alignment can properly be performed after the full-curing process of the protective film 15b.

In a case where the protective film precursor solution 15a is applied to each of the semiconductor elements 1 after peeling from the dicing tape 2, productivity is low because positioning of the dispenser is required for each of the semiconductor 1. In contrast, in Embodiment 1, the protective film precursor solution 15a is applied in a state of the semiconductor elements 1 being affixed to the dicing tape 2. According to such a process, positioning of the dispenser can be performed for the plurality of semiconductor elements 1 through positioning of the dicing line, so that the number of times positioning of the dispenser is performed can be reduced to improve productivity. By applying the protective film precursor solution 15a in the state of the semiconductor elements 1 being affixed to the dicing tape 2, going of the protective film precursor solution 15a around rear surfaces of the semiconductor elements 1 to contaminate a joint surface of a circuit pattern of the rear surface electrode 13e and the like can be suppressed.

Furthermore, the dicing tape 2 is typically disposable, and thus is not, used in processing of a next product if the dicing tape 2 is contaminated by the protective film precursor solution 15a or damaged by laser machining, for example. The semiconductor device can thereby efficiently be produced without any concern for damage and contamination of the semiconductor elements 1 caused by the deteriorated dicing tape 2.

In addition, cutting of the protective film 15b using a laser can suppress stress to the protective film 15b compared with mechanical cutting using, for example, a blade. Peeling, from the semiconductor element 1, of the protective film 15b on which full-curing has not been performed to have low adhesion can thus be suppressed.

Embodiment 2

FIG. 16 is a flowchart showing a semiconductor device manufacturing method according to Embodiment 2 of the present invention. Processes similar to those in the step S1 and the step S2 in Embodiment 1 are performed respectively in a step S11 and a step S12 to yield the same structure as that in FIGS. 3 and 4.

Figure 17:
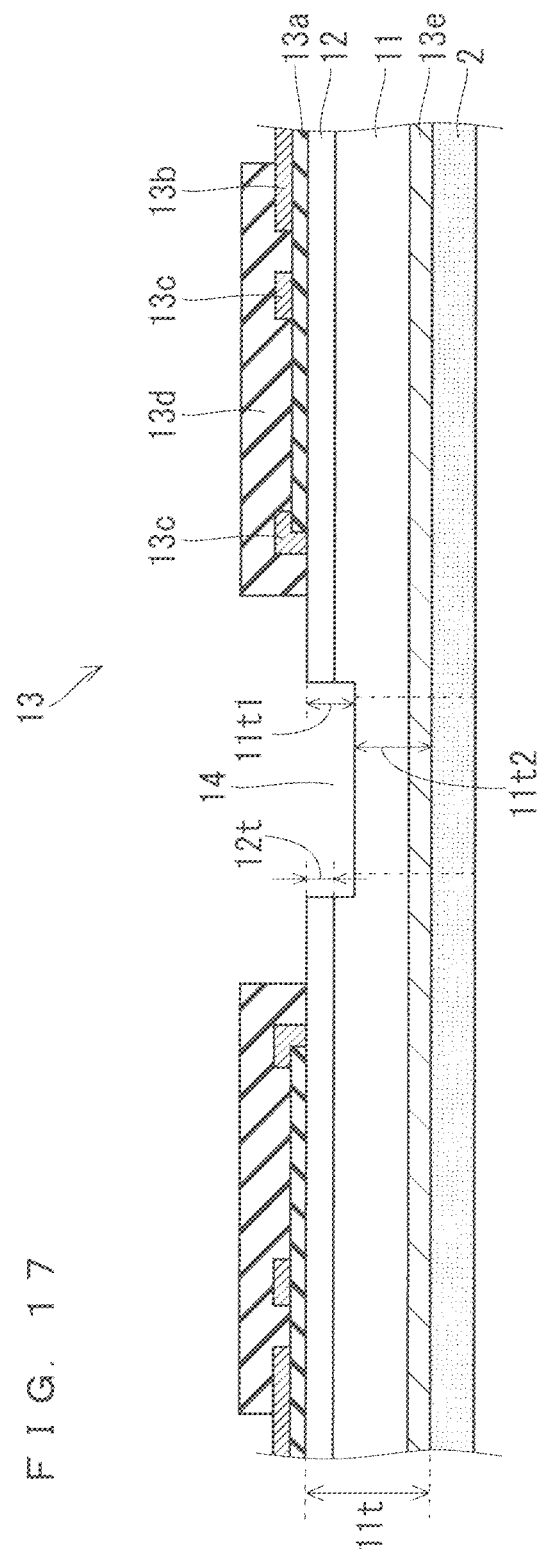
FIG. 17 is an enlarged sectional view illustrating a process of a semiconductor device according to Embodiment 2.

In a step S13, the groove 14 is formed in the semiconductor substrate 11 between the plurality of semiconductor element structures 13 using, for example, a blade as illustrated in FIGS. 17 and 18. The groove 14 according to Embodiment 2 penetrates, from a side opposite a side of the dicing tape 2, through the epitaxial layer 12 into the semiconductor substrate 11. That is to say, the groove 14 has a depth 11t1 greater than a thickness 12t of the epitaxial layer 12. The thickness 12t of the epitaxial layer 12 is designed based on a rated breakdown voltage of the semiconductor element 1. In a semiconductor device made of SiC, the thickness 12t is generally 20 µm or less, and a thickness of approximately 10 µm is the mainstream. The depth 11t1 of the groove 14 is at least 20 µm or more, and can surely be greater than the thickness 12t of the epitaxial layer 12 if it is approximately 50 µm. In a case where the semiconductor substrate 11 has a thickness 11t of approximately 100 µm and the groove 14 has a depth 11t1 of approximately 50 µm, the remaining portion of the semiconductor substrate 11 under the groove 14 has a thickness 11t2 of approximately 50 µm.

Figure 19:
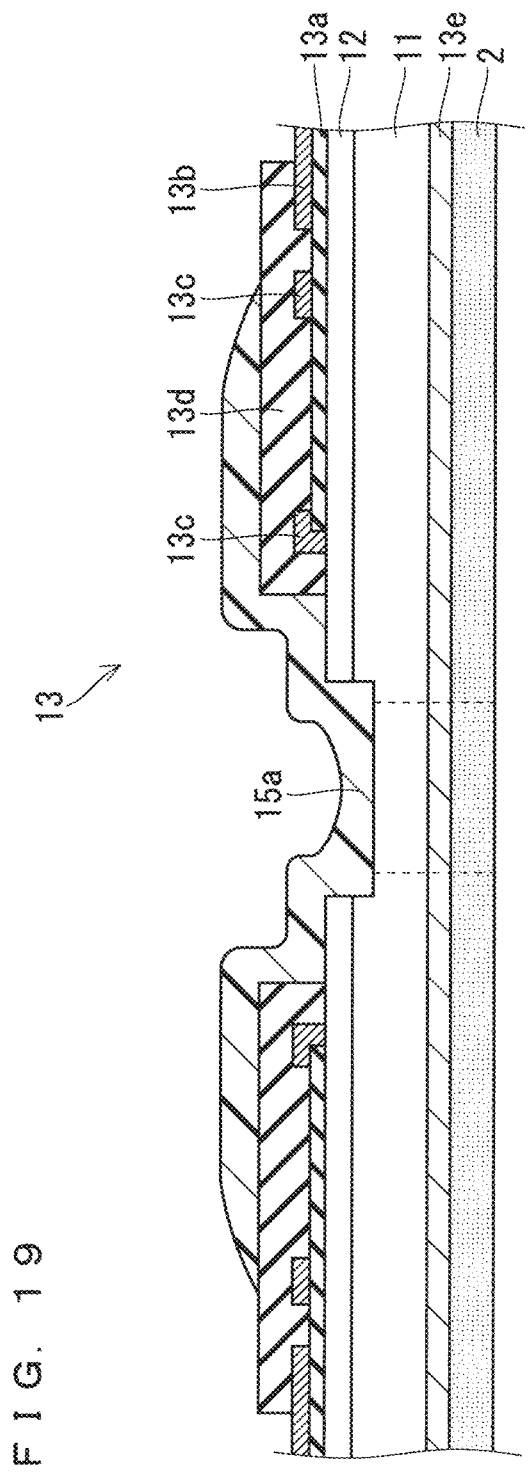
FIG. 19 is an enlarged sectional view illustrating a process of the semiconductor device according to Embodiment 2.
Figure 20:
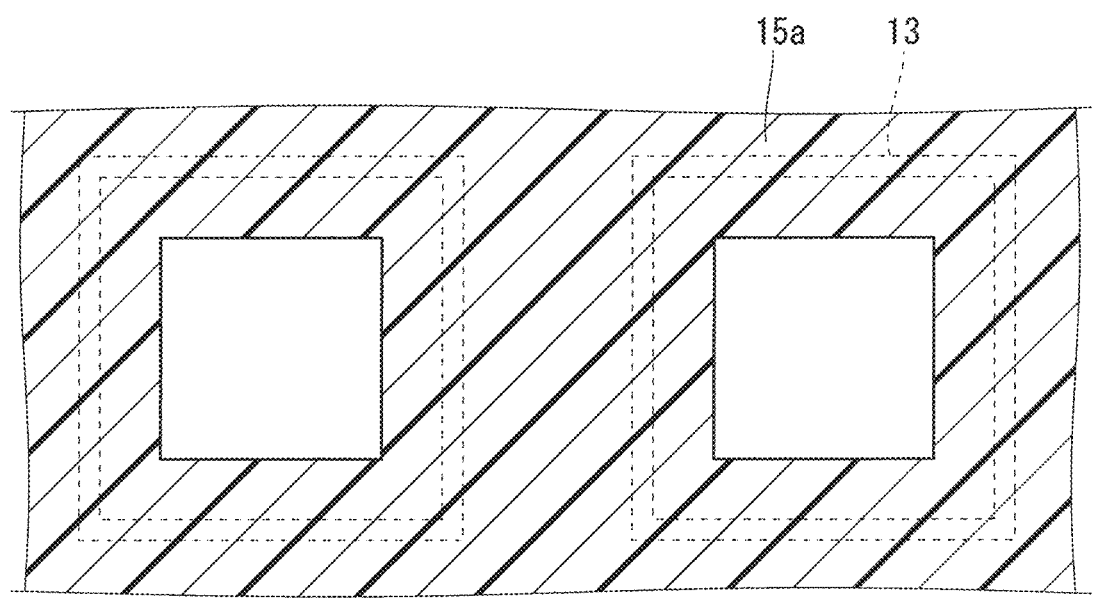
FIG. 20 is an enlarged plan view illustrating the process of the semiconductor device according to Embodiment 2.

In a step S14, the protective film precursor solution 15a is applied over the end of each of the plurality of semiconductor element structures 13 and the side surface and the bottom surface of the groove 14 as illustrated in FIGS. 19 and 20. It is preferable to selectively apply the protective film precursor solution 15a only to the above-mentioned region along the dicing line using, for example, the dispenser and the like. By applying the protective film precursor solution 15a in such a manner, the protective film precursor solution 15a can be applied only to an end of each of the semiconductor element structures 13 and the dicing line without being applied to the other region, so that an adverse effect of the protective film precursor solution 15a on the other processes can be suppressed. Furthermore, reduction in thickness of the protective film precursor solution 15a and thickness of the protective film 15b to be formed in the next process at a corner of the semiconductor element structure 13 at which application is necessary, which is caused by excessive wetting of the protective film precursor solution 15a, can be suppressed.

In Embodiment 1, the protective film precursor solution 15a is applied after the semiconductor substrate 11 is completely cut, so that the depth of the groove 14 is substantially the same as the thickness 11t of the semiconductor substrate 11. In contrast, in Embodiment 2, cutting is stopped in the middle of the semiconductor substrate 11, so that the depth 11t1 of the groove 14 in Embodiment 2 is shallower than the depth of the groove 14 in Embodiment 1. Reduction in thickness of the protective film precursor solution 15a as described above and reduction in thickness of the protective film 15b to be formed in the next process can further be suppressed.

In a step S15, the prebaking process of roughly drying the solvent in the protective film precursor solution 15a to form the protective film 15b is performed. Rough drying is similar to rough drying performed in the step S5 in Embodiment 1, and the protective film precursor solution 15a is heated in the air atmosphere using the hot plate at approximately 150° C., for example. Although heat treatment is performed in a state of the plurality of semiconductor element structures 13 being connected by the rear surface electrode 13e and the like on a side of the rear surface of the semiconductor substrate 11, heat treatment at a low temperature of approximately 150° C. can suppress the increase in film stress of the protective film 15b and the rear surface electrode 13e to avoid warping of the semiconductor substrate 11. In a case where the full-curing process of performing heat treatment at approximately 300° C. is performed at this time point, the film stress of the rear surface electrode 13e greatly increases to warp the semiconductor substrate 11 to make it difficult to properly perform the cutting process and the like thereafter.

Figure 21:
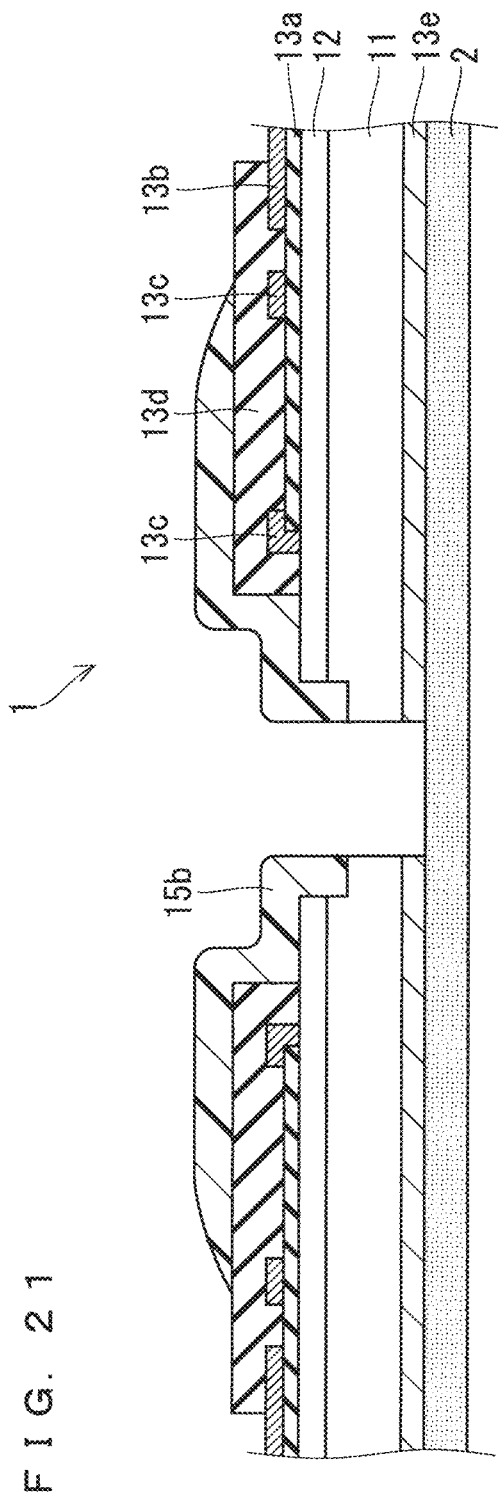
FIG. 21 is an enlarged sectional view illustrating a process of the semiconductor device according to Embodiment 2.
Figure 22:
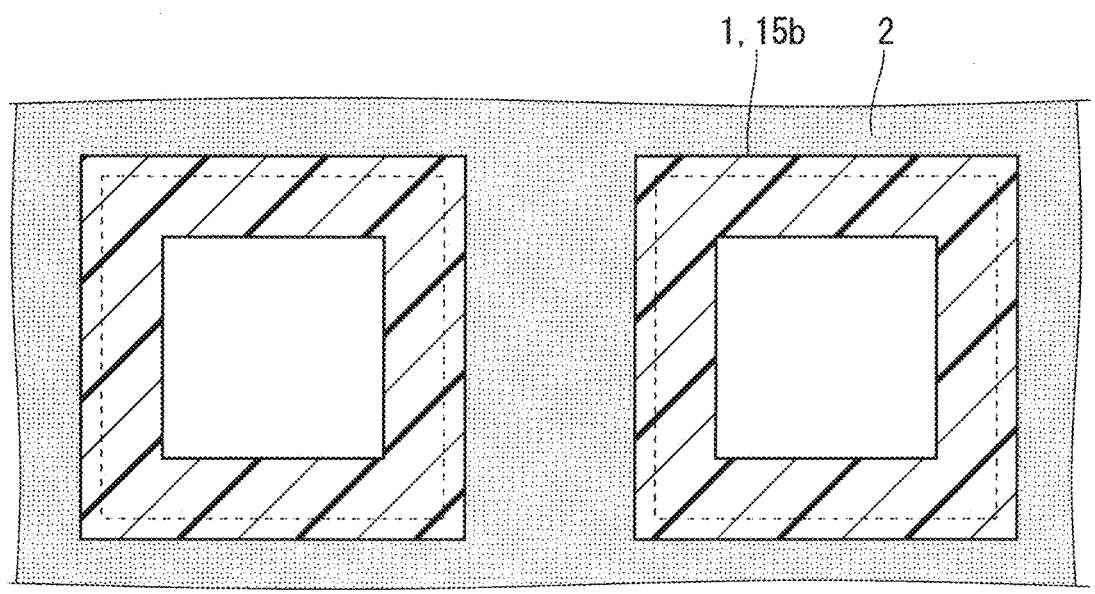
FIG. 22 is an enlarged plan view illustrating the process of the semiconductor device according to Embodiment 2.

In the step S16, the protective film 15b is cut along the groove 14, that is, the dicing line, while the protective film 15b at the end and the side wall of the semiconductor element structure 13 is left as illustrated in FIGS. 21 and 22. In Embodiment 2, the protective film 15b and the semiconductor substrate 11 under the protective film 15b are cut together. That is to say, the process of cutting between the plurality of semiconductor element structures 13 is performed in parallel with the process of cutting the protective film 15b. Such a process can increase productivity.

In a case where the blade is used for cutting in the step S16, chipping can be caused. However, at a time point at which the process in the step S16 is performed, the epitaxial layer 12 to control breakdown voltage characteristics of the semiconductor element 1 has already been cut to leave only a lower portion of the semiconductor substrate 11. Thus, if chipping is caused in the lower portion of the semiconductor substrate 11, a possibility of poor characteristics is reduced, and production can be performed while maintaining quality.

In a ease where a laser is used for cutting in the step S16, laser light having a relatively large power is required to cut the semiconductor substrate 11. The remaining portion of the semiconductor substrate 11 under the groove 14 is thus desirably finished to be as thin as possible, for example, to have a thickness 11t2 of 50 μm or less.

Figure 24:
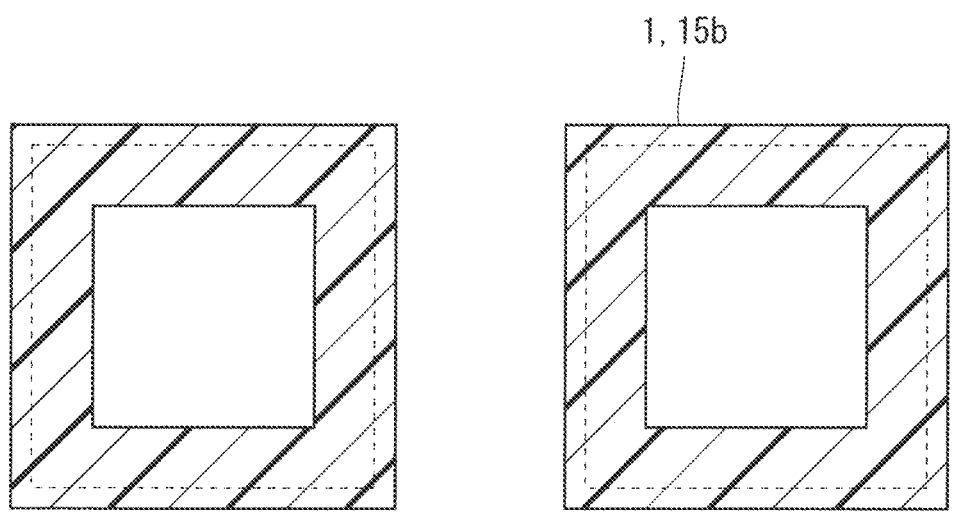
FIG. 24 is an enlarged plan view illustrating the process of the semiconductor device according to Embodiment 2.

In a step S17, the plurality of semiconductor elements 1 are peeled from the dicing tape 2 to be picked up as illustrated in FIGS. 23 and 24. In preparation for the next full-curing process, the picked up semiconductor elements 1 are housed in the heat-resistant tray made of metal or carbon, for example.

Figure 26:
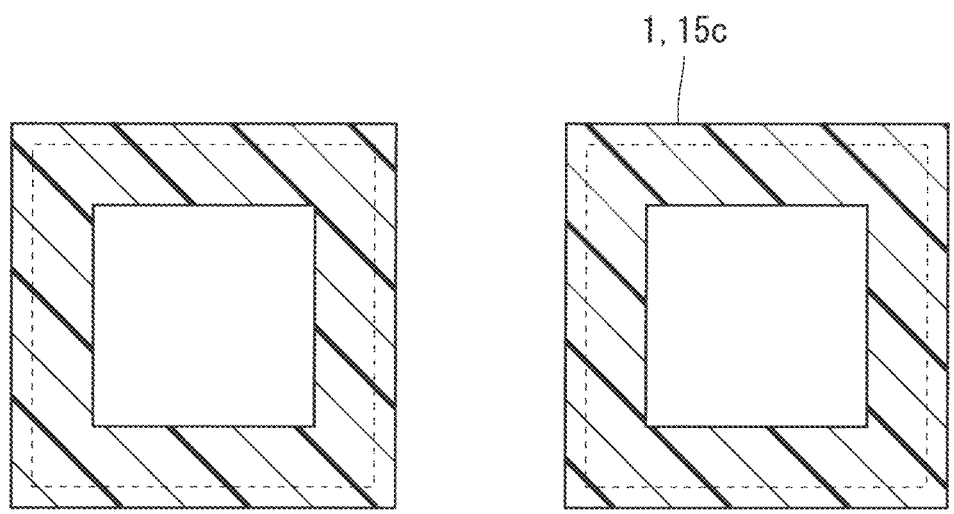
FIG. 26 is an enlarged plan view illustrating the process of the semiconductor device according to Embodiment 2.

In a step S18, full-curing to evaporate the solvent in the protective film 15b is performed to form the full-cured protective film 15c as illustrated in FIGS. 25 and 26. The prebaking process in the step S15 to roughly dry the solvent is typically performed at a temperature of 150° C. or less. The full-curing process in the step S18 to evaporate the solvent in the protective film 15b so that 95% or more of the solvent initially contained in the protective film precursor solution 15a is evaporated is perforated at a temperature of more than 150° C. In a case where the protective film 15b is polyimide, for example, the full-curing process is performed at a temperature of 180° C. or more if polyimide is required to be imidized in the full-curing process. As one example, the protective film 15b is herein heated at a temperature of approximately 300° C. in the full-curing process in the step S18. Full-curing may be performed between the step S16 and the step S17 although it is performed herein after the step S17. After the step S18, the semiconductor element is sealed with the curable resin, such as the epoxy resin, as necessary to form the package.

Summary of Embodiment 2

In Embodiment 2, the full-curing process of the protective film 15b is performed after the groove 14 penetrating through the epitaxial layer 12 from the side opposite the side of the dicing tape 2 and the protective film 15b are formed, and the plurality of semiconductor elements 1 are separated by cutting of the semiconductor substrate 11. Cutting of the semiconductor substrate 11 can thereby be performed in a state before full-curing in which warping of the semiconductor substrate 11 is suppressed, so that is can properly be cut. Chipping of the epitaxial layer 12 caused by cutting of the semiconductor substrate 11 can be suppressed to suppress reduction in breakdown voltage characteristics of the semiconductor element 1. Furthermore, unnecessary wetting of the protective film precursor solution 15a can be suppressed.

Modification

In Embodiment 2, the protective film 15b and the semiconductor substrate 11 under the protective film 15b are cut together in the step S16, but cutting is not limited to cutting in this manner. For example, the process of cutting between the plurality of semiconductor element structures 13 may be performed separately from the process of cutting the protective film 15b. A laser may be used for cutting the protective film 15b, and a blade may be used for cutting between the plurality of semiconductor element structures 13. According to such a configuration, entrainment and attachment of remnants of the protective film 15b to a blade and shortening the life of a grinding wheel blade can be suppressed to increase productivity in the manufacturing method using the blade.

Embodiments and modifications of the present invention can freely be combined with each other, and can be modified or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device manufacturing method comprising processes of:
    (a) preparing a semiconductor substrate over which a plurality of semiconductor element structures are disposed, the semiconductor substrate including at least one wiring and a wiring covering film;
    (b) affixing the semiconductor substrate to a dicing tape;
    (c) forming, after the process (b), a groove in the semiconductor substrate between the plurality of semiconductor element structures;
    (d) applying a protective film precursor solution over an end of each of the plurality of semiconductor element structures, a side surface and a bottom surface of the groove, and a side surface of the wiring covering film;
    (e) roughly drying a solvent in the protective film precursor solution to form a protective film;
    (f) cutting the protective film along the groove;
    (g) cutting between the plurality of semiconductor element structures;
    (h) peeling, after the process (f), a plurality of semiconductor elements formed by cutting in the process (g) from the dicing tape; and
    (i) performing, after the process (g) or the process (h), full-curing to evaporate a solvent in the protective film.

2. The semiconductor device manufacturing method according to claim 1, wherein
    the process (c) includes the process (g).

3. The semiconductor device manufacturing method according to claim 2, wherein
    a laser is used for cutting the protective film in the process (f).

4. The semiconductor device manufacturing method according to claim 1, wherein
    an epitaxial layer is disposed on a surface of the semiconductor substrate prepared in the process (a),
    the groove formed in the process (c) penetrates, from a side opposite a side of the dicing tape, through the epitaxial layer into the semiconductor substrate, and
    the process (g) is performed in parallel with the process (f).

5. The semiconductor device manufacturing method according to claim 1, wherein
    an epitaxial layer is disposed on a surface of the semiconductor substrate prepared in the process (a),
    the groove formed in the process (c) penetrates, from a side opposite a side of the dicing tape, through the epitaxial layer into the semiconductor substrate,
    the process (g) is performed separately from the process (f),
    a laser is used for cutting the protective film in the process (f), and
    a blade is used for cutting between the plurality of semiconductor element structures in the process (g).

6. The semiconductor device manufacturing method according to claim 1, wherein
    in the process (c), a portion of the semiconductor substrate remains under the groove.

7. A semiconductor device manufacturing method comprising processes of:
    (a) preparing a semiconductor substrate over which a plurality of semiconductor element structures are disposed;
    (b) affixing the semiconductor substrate to a dicing tape;
    (c) forming, after the process (b), a groove in the semiconductor substrate between the plurality of semiconductor element structures;
    (d) applying a protective film precursor solution over an end of each of the plurality of semiconductor element structures and a side surface and a bottom surface of the groove and forming a recess corresponding to the groove on an upper surface of the protective film precursor solution;
    (e) roughly drying a solvent in the protective film precursor solution to form a protective film;
    (f) cutting the protective film along the groove;
    (g) cutting between the plurality of semiconductor element structures;
    (h) peeling, after the process (f), a plurality of semiconductor elements formed by cutting in the process (g) from the dicing tape; and
    (i) performing, after the process (g) or the process (h), full-curing to evaporate a solvent in the protective film.

8. The semiconductor device manufacturing method according to claim 7, wherein
    the process (c) includes the process (g).

9. The semiconductor device manufacturing method according to claim 8, wherein
    a laser is used for cutting the protective film in the process (f).

10. The semiconductor device manufacturing method according to claim 7, wherein
    an epitaxial layer is disposed on a surface of the semiconductor substrate prepared in the process (a),
    the groove formed in the process (c) penetrates, from a side opposite a side of the dicing tape, through the epitaxial layer into the semiconductor substrate, and
    the process (g) is performed in parallel with the process (f).

11. The semiconductor device manufacturing method according to claim 7, wherein
    an epitaxial layer is disposed on a surface of the semiconductor substrate prepared in the process (a),
    the groove formed in the process (c) penetrates, from a side opposite a side of the dicing tape, through the epitaxial layer into the semiconductor substrate,
    the process (g) is performed separately from the process (f),
    a laser is used for cutting the protective film in the process (f), and
    a blade is used for cutting between the plurality of semiconductor element structures in the process (g).

12. The semiconductor device manufacturing method according to claim 7, wherein
    in the process (c), a portion of the semiconductor substrate remains under the groove.

* * * * *